(12) United States Patent
Lu et al.

(10) Patent No.: US 10,218,449 B2
(45) Date of Patent: Feb. 26, 2019

(54) FREQUENCY/PHASE SYNTHESIZER NOISE CANCELLATION

(71) Applicant: QUALCOMM Incorporated, San Diego, CA (US)

(72) Inventors: Yue Lu, Los Gatos, CA (US); Zuow-Zun Chen, San Jose, CA (US); Jeongsik Yang, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/893,461

(22) Filed: Feb. 9, 2018

(65) Prior Publication Data

US 2019/0028209 A1 Jan. 24, 2019

Related U.S. Application Data

(60) Provisional application No. 62/535,169, filed on Jul. 20, 2017.

(51) Int. Cl.
| | |
|---|---|
| *H04B 15/00* | (2006.01) |
| *H04L 7/00* | (2006.01) |
| *G01S 19/22* | (2010.01) |
| *H04L 27/26* | (2006.01) |

(52) U.S. Cl.
CPC ............ *H04B 15/00* (2013.01); *G01S 19/22* (2013.01); *H04L 7/0012* (2013.01); *H04L 27/266* (2013.01); *H04L 27/2695* (2013.01)

(58) Field of Classification Search
CPC .... G01S 19/22; H04L 27/266; H04L 27/2695

USPC .......................................................... 375/354
See application file for complete search history.

(56) References Cited

U.S. PATENT DOCUMENTS

| | | | |
|---|---|---|---|
| 5,422,646 A * | 6/1995 | Lewis | G01S 13/528 342/137 |
| 5,982,831 A | 11/1999 | Chu | |
| 8,258,877 B2 | 9/2012 | Goel et al. | |
| 9,071,251 B2 | 6/2015 | Heo et al. | |
| 9,094,028 B2 | 7/2015 | Hossain et al. | |
| 2005/0062510 A1 * | 3/2005 | Zarate | H03L 7/0814 327/158 |
| 2006/0281425 A1 | 12/2006 | Jungerman | |
| 2008/0279260 A1 * | 11/2008 | Yeh | G01S 19/34 375/150 |

* cited by examiner

*Primary Examiner* — Leila Malek
(74) *Attorney, Agent, or Firm* — Qualcomm Incorporated/Seyfarth Shaw LLP (57) ABSTRACT

An open-loop feed-forward cross-correlator noise cancellation device includes a synthesizer to generate a synthesized output clock signal based on a reference clock signal. The open-loop feed-forward cross-correlator noise cancellation device also includes a cross-correlator device coupled to the synthesizer to receive the reference clock signal and the synthesized output clock signal and to cross-correlate the reference clock signal and the synthesized output clock signal to generate a cross-correlated output signal. The open-loop feed-forward cross-correlator noise cancellation device further includes a signal control delay line coupled to the cross-correlator device to generate an anti-phase noise signal based on the cross-correlated output signal to counter uncorrelated phase noise from additional circuitry of the synthesizer.

20 Claims, 7 Drawing Sheets

FREQUENCY/PHASE SYNTHESIZER NOISE CANCELLATION

CROSS-REFERENCE TO RELATED APPLICATION

The present application claims the benefit of U.S. Provisional Patent Application No. 62/535,169, filed on Jul. 20, 2017, and titled "FREQUENCY/PHASE SYNTHESIZER NOISE CANCELLATION," the disclosure of which is expressly incorporated by reference herein in its entirety.

TECHNICAL FIELD

The present disclosure generally relates to phase noise and spur cancellation of a reference clock signal and synthesizer (timing) system. More specifically, aspects of the present disclosure relate to synthesizer noise cancellation.

BACKGROUND

Synthesizers (e.g., phase locked loops (PLLs), frequency/phase synthesizers, and delay locked loops (DLLs)) have been serving as key components in different systems, and they have evolved from simple feedback loops to sophisticated architectures (e.g., integer-N, fractional-N, and all-digital). A reference oscillator or clock is sometimes included in synthesizer (e.g., PLL) circuitry, although this is not strictly part of the loop itself even though a reference signal from the reference oscillator is specified for operation of the PLL.

Most frequency/phase synthesizers are based around a PLL. Synthesizers are widely used in all forms of radio communications equipment today. These synthesizers are found in a variety of devices from cellular phones to all forms of wireless products and domestic radios and televisions to professional radio frequency equipment such as signal generators and spectrum analyzers.

Synthesizers not only offer high levels of stability and accuracy (determined by the reference, which is normally a crystal oscillator), they are also easy to control from digital circuitry such as microprocessors. Some drawbacks of synthesizers include noise, such as phase and/or frequency noise. For example, the noise may include input noise from a reference clock and a phase and frequency detector, as well as noise from an oscillator such as a voltage controlled oscillator (VCO). Some techniques improve noise performance by properly selecting a loop bandwidth. This approach, however, suffers from an intrinsic limitation. As the VCO frequency increases, the noise begins to dominate and becomes more difficult to suppress. Accordingly, it is desirable to develop techniques to overcome these drawbacks.

SUMMARY

An open-loop feed-forward cross-correlator noise cancellation device includes a synthesizer to generate a synthesized output clock signal based on a reference clock signal. The open-loop feed-forward cross-correlator noise cancellation device also includes a cross-correlator device coupled to the synthesizer to receive the reference clock signal and the synthesized output clock signal and to cross-correlate the reference clock signal and the synthesized output clock signal to generate a cross-correlated output signal. The open-loop feed-forward cross-correlator noise cancellation device further includes a delay line (e.g., a signal control delay line) coupled to the cross-correlator device to generate an anti-phase noise signal based on the cross-correlated output signal to counter uncorrelated phase noise from additional circuitry of the synthesizer. For example, the delay line includes any circuitry in which a delay can be modulated by a control signal.

An open-loop feed-forward cross-correlator noise cancellation device includes means for generating a synthesized output clock signal based on a reference clock signal. The open-loop feed-forward cross-correlator noise cancellation device also includes a cross-correlator device, coupled to the synthesized output clock signal generating means, to receive the reference clock signal and the synthesized output clock signal and to cross-correlate the reference clock signal and the synthesized output clock signal to generate a cross-correlated output signal. The open-loop feed-forward cross-correlator noise cancellation device further includes means for generating an anti-phase noise signal based on the cross-correlated output signal to counter uncorrelated phase noise from circuitry of the synthesizer.

A method to achieve open-loop feed-forward cross-correlator noise cancellation may include generating a synthesized output clock signal based on a reference clock signal. The method also includes cross-correlating the reference clock signal and the synthesized output clock signal to generate a cross-correlated output signal. The method further includes generating an anti-phase noise signal based on the cross-correlated output signal to counter uncorrelated phase noise from circuitry of a synthesizer.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR" and the use of the term "or" is intended to represent an "exclusive OR".

Aspects of the present disclosure relate to phase noise improvement and spur reduction for synthesizers. The synthesizers may include frequency/phase synthesizers, phase locked loops (PLLs), or delay lock loops (DLLs). Synthesizers are included in many radio chip-sets from cellular phones to radios and televisions.

Synthesizers and a reference clock may be included in various timing circuitry or reference clock signal and synthesizer (timing) systems. The reference clock signal and synthesizer (timing) systems may be for analog-to-digital converters (ADCs), digital-to-analog converters (DACs), central processing units (CPUs), receive blocks (e.g., mixer, sampler, etc.) of a wireless communication device, transmit blocks (e.g., mixer, synchronizer, etc.) of the wireless communication device and other timing critical blocks are subject to phase uncertainty. The phase uncertainty may include phase noise (e.g., random noise), spurs (e.g., cyclostationary noise), etc. One of the contributors to phase uncertainty is a clock source (which generates a reference clock signal) and/or the synthesizer of the reference clock signal and synthesizer system.

Phase noise/spur specification is an important metric for synthesizers. As data rates are scaled up with higher modulation depth, phase noise induced error vector magnitude (EVM) needs to be further suppressed without large power/area penalty. Baseband clock jitter should also be improved without large power/area penalty. Conventional ways of improving phase noise include improving quality factor of passive components and upscaling device sizes/capacitor loads that would result in consumption of larger area and more power. These conventional approaches have limited return on figure of merit (FoM) of the PLL and thus are not ideal for low power and low phase noise applications in smaller form factor devices.

In operation, a synthesizer (e.g., PLL) frequency and phase is locked to an incoming or input reference clock signal. The reference clock signal may originate from a clock source (e.g., a crystal oscillator) that is coupled to the synthesizer. The reference clock may include phase noise. Additional circuits of the PLL (e.g., a voltage controlled oscillator (VCO)) generate a higher frequency (at the output of the synthesizer) that is a multiple of the frequency of the reference clock. For example, some of the additional circuits are used for phase alignment and frequency multiplication. These additional circuits introduce additional noise that adds to noise of a radio frequency input signal and the reference clock. For example, the noise from the additional circuits of the synthesizer includes noise from the VCO, phase and frequency detector (PFD), charge pump (CP), and the frequency divider coupled to the feedback loop of the synthesizer. The noise of the timing circuitry (e.g., a reference clock signal and synthesizer system), however, is dominated by the noise from the VCO and the additional circuits of the synthesizer. This follows because the reference clock is usually a clean reference with limited noise associated with it. Accordingly, it is desirable to develop a technique to reduce noise from the additional circuits.

Some techniques to reduce noise from the additional circuits include injection-locked PLLs (e.g., sub-harmonically injection-locked PLLs) that periodically inject signals to adjust or clean a VCO (e.g., to clean only the VCO within a feedback loop of the PLL) of the injection-locked PLLs. The injection-locked PLLs include an additional path, which often introduces signal-shaping circuitry for the reference clock by using combinational logic. For example, the injection-locked PLLs use a cleaner reference clock to generate a very narrow pulse to periodically align the VCO edges. The injection-locked PLLs use circuitry of the additional path to reduce the phase noise contribution of the VCO of the PLL.

One limitation of the injection-locked PLL comes from a trade-off between phase noise and frequency locking range. Increasing the equivalent quality factor of the VCO improves VCO phase noise but unfortunately reduces the frequency locking range for achieving the desirable improvement. For example, the frequency locking range is limited to a smaller frequency range. This limitation only gets worse for sub-harmonically injection-locked cases because the frequency of the VCO is faster (e.g., by a multiple of 5 or 20) than the frequency of the reference clock such that the correction happens less frequently, which is equivalent to a further reduced frequency locking range. Another disadvantage of the injection-locked PLL is that each time it injects the clean-up pulse to the VCO, it causes disturbance. Such disturbance shows up at the synthesizer output directly as reference spurs that degrade jitter performance.

Other techniques use a multiplying delay locked loop (MDLL) for high-speed on-chip generation to improve overall system phase noise. However, the MDLLs can be viewed as a special case of the sub-harmonically injection-locked PLLs with the difference being that the MDLLs are injection-locking the VCO by replacing their edges completely with a reference edge. For example, the MDLL uses a multiplexer instead of an addition path of the sub-harmonically injection-locked PLLs. The MDLLs suffer from similar drawbacks as the sub-harmonically injection-locked PLLs, and they are only applicable to harmonic VCOs (e.g., with sharp edges). The MDLLs and the injection-locked PLLs also fail to address noise associated with the additional circuits, such as charge pump, loop filters, and feedback frequency dividers, within the synthesizer.

Aspects of the present disclosure break the conventional phase noise/power trade-off and achieve a target noise/spur level with improved figure of merit (FoM) of the PLL. In one aspect of the disclosure, an open-loop feed-forward cross-correlator noise cancellation device samples a synthesizer output signal using the reference clock signal to cancel out noise from circuitry within the synthesizer. For example, starting with a good reference clock, an output frequency signal of the synthesizer (e.g., synthesized output clock signal), which is a higher frequency signal because it is a multiple (for integer-N PLL) of a frequency of the reference clock, is generated at an output of the synthesizer. In the case of a fractional-N PLL, different divisional factors are used to obtain a fractional frequency. The frequency and the phase noise of the reference clock are different from the frequency and phase noise of the output frequency signal. For example, the output frequency signal may include additional noise from additional circuits of the synthesizer. The additional circuits may include a phase and frequency detector, a charge pump, a feedback loop filter, the VCO, a divider, etc. The noise of the additional circuits is uncorrelated with the noise from the clock reference.

The open-loop feed-forward cross-correlator noise cancellation device includes a synthesizer, a cross-correlator device coupled to the synthesizer, and a signal control delay line coupled to the cross-correlator device. The synthesizer generates a synthesized output clock signal based on a reference clock signal. The cross-correlator device receives the reference clock signal and the synthesized output clock signal, and cross-correlates the reference clock signal and the synthesized output clock signal to generate a cross-correlated output signal. The signal control delay line generates an anti-phase noise signal based on the cross-correlated output signal to counter uncorrelated phase noise from the additional circuits of the synthesizer.

The aspects of the present disclosure offer high levels of stability and achieve wideband cancellation with a relatively simple design of the frequency/phase synthesizer. The frequency/phase synthesizer includes an implicit phase modulator stage that is achieved with local oscillator distribution buffers and corresponding low dropout (LDO) regulators. The LDO regulator may be used as the noise cancellation point (without additional amplitude and phase modulation blocks). The noise cancellation point may be a global noise cancellation point or may be a local noise cancellation point. The local noise cancellation point may correspond to a local clock distribution network for particular circuitry and the global noise cancellation point may correspond to a global clock distribution network that is shared between multiple circuits (e.g., between same or different circuitry). The noise cancellation point can be completely disabled.

Figure 1:
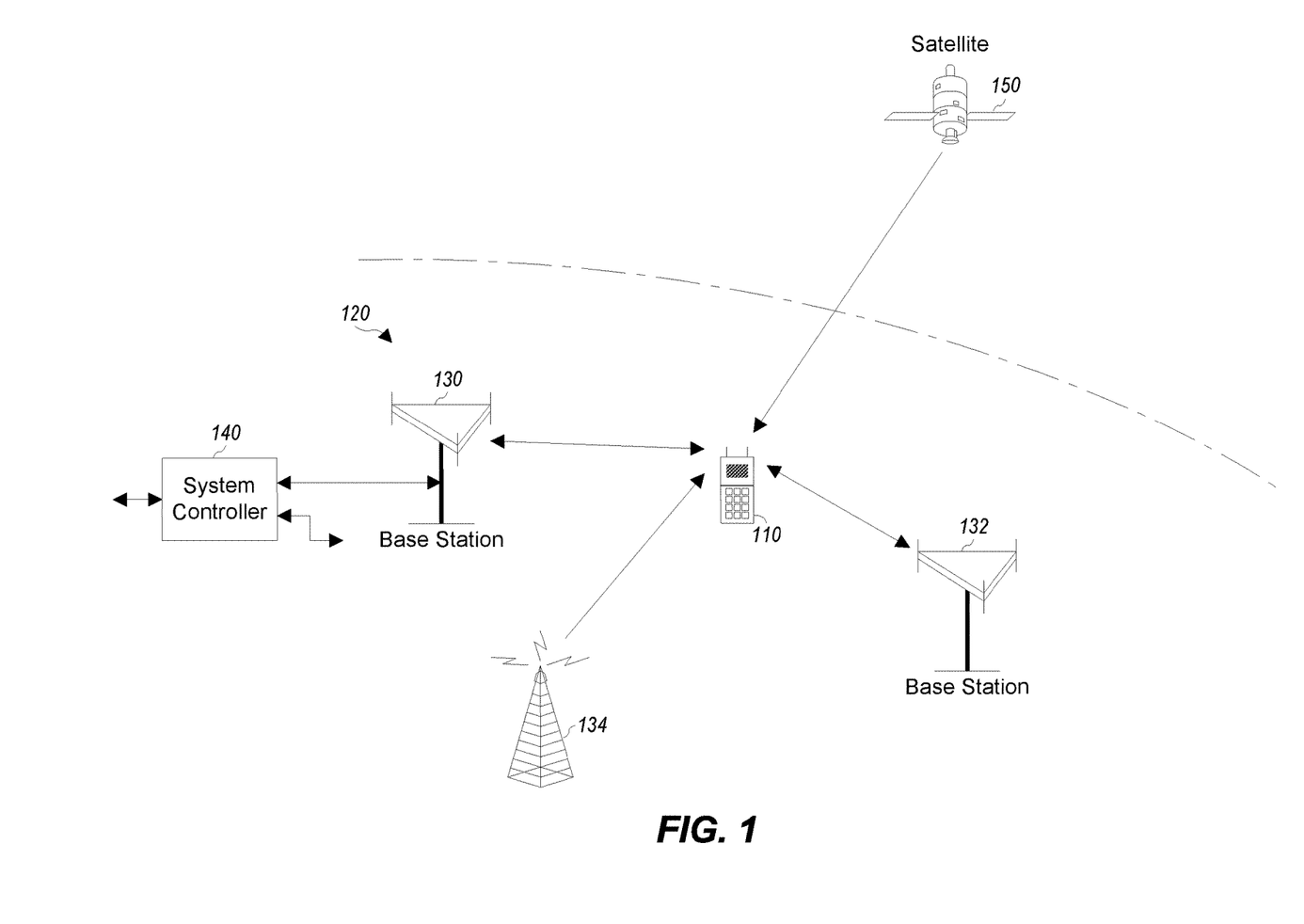
FIG. 1 shows a wireless device communicating with a wireless communication system.

FIG. 1 shows a wireless device 110, which may incorporate the noise cancellation, communicating with a wireless communication system 120. The wireless communication system 120 may be a 5G system, a long term evolution (LTE) system, a code division multiple access (CDMA) system, a global system for mobile communications (GSM) system, a wireless local area network (WLAN) system, or some other wireless system. A CDMA system may implement wideband CDMA (WCDMA), time division synchronous CDMA (TD-SCDMA), CDMA2000, or some other version of CDMA. For simplicity, FIG. 1 shows the wireless communication system 120 including two base stations 130 and 132 and one system controller 140. In general, a wireless system may include any number of base stations and any number of network entities.

A wireless device 110 may be referred to as a user equipment (UE), a mobile station, a terminal, an access terminal, a subscriber unit, a station, etc. The wireless device 110 may also be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth device, etc. The wireless device 110 may be capable of communicating with the wireless communication system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communication such as 5G, LTE, CDMA2000, WCDMA, TD-SCDMA, GSM, 802.11, etc.

The wireless device 110 may support carrier aggregation, which is operation on multiple carriers. Carrier aggregation may also be referred to as multi-carrier operation. According to an aspect of the present disclosure, the wireless device 110 may be able to operate in low-band from 698 to 960 megahertz (MHz), mid-band from 1475 to 2170 MHz, and/or high-band from 2300 to 2690 MHz, ultra-high band from 3400 to 3800 MHz, and long-term evolution (LTE) in LTE unlicensed bands (LTE-U/LAA) from 5150 MHz to 5950 MHz. Low-band, mid-band, high-band, ultra-high band, and LTE-U refer to five groups of bands (or band groups), with each band group including a number of frequency bands (or simply, "bands"). For example, in some systems each band may cover up to 200 MHz and may include one or more carriers. For example, each carrier may cover up to 40 MHz in LTE. Of course, the range for each of the bands is merely exemplary and not limiting, and other frequency ranges may be used. LTE Release 11 supports 35 bands, which are referred to as LTE/UMTS bands and are listed in 3GPP TS 36.101. The wireless device 110 may be configured with up to five carriers in one or two bands in LTE Release 11.

Figure 2:
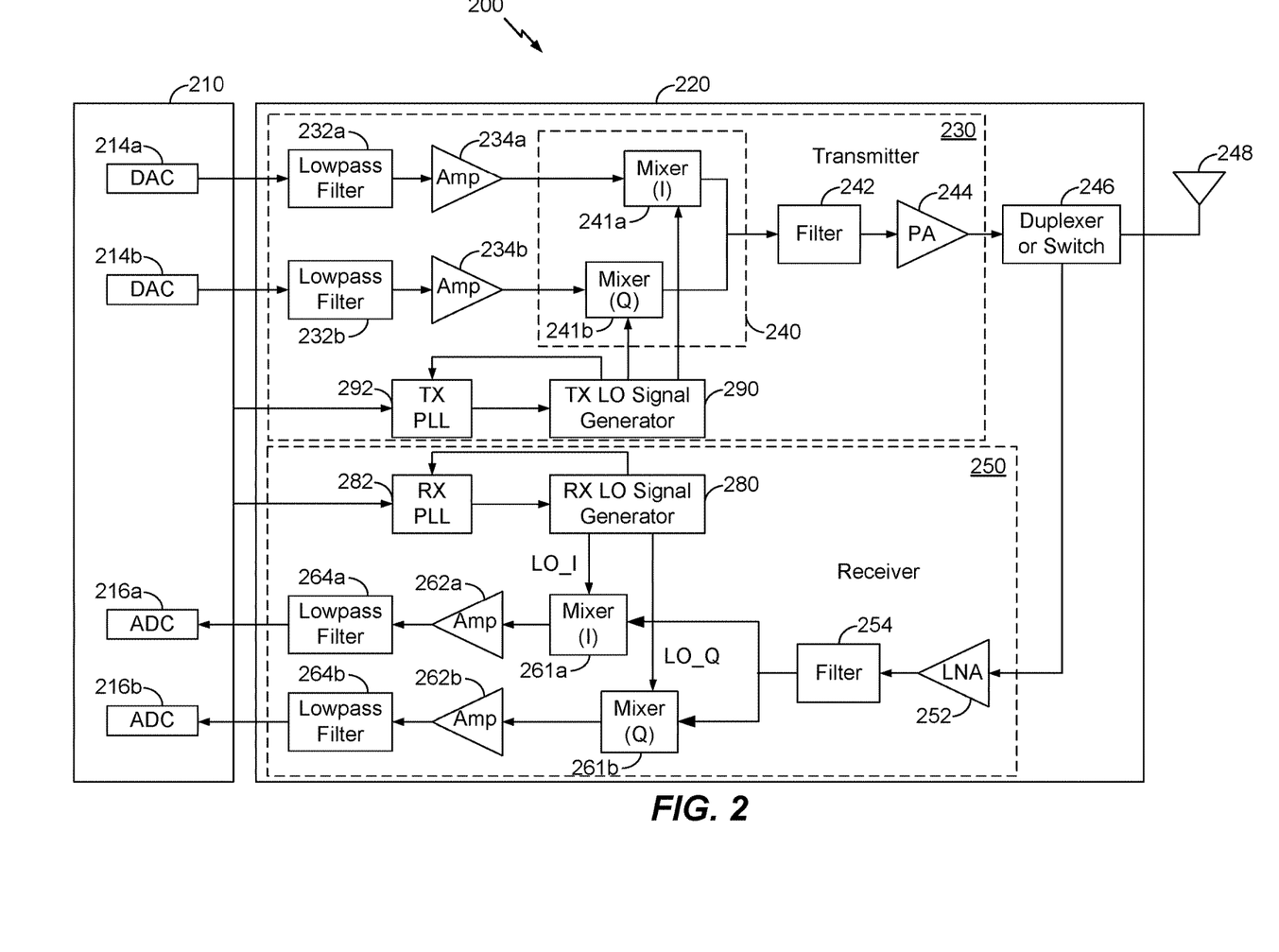
FIG. 2 shows a block diagram of the wireless device in FIG. 1, according to an aspect of the present disclosure.

FIG. 2 shows a block diagram of an exemplary design of a wireless device 200, such as the wireless device 110 shown in FIG. 1. FIG. 2 shows an example of a transceiver 220, which may be a wireless transceiver (WTR). In general, the conditioning of the signals in a transmitter 230 and a receiver 250 may be performed by one or more stages of amplifier(s), filter(s), upconverters, downconverters, and the like. These circuit blocks may be arranged differently from the configuration shown in FIG. 2. Furthermore, other circuit blocks not shown in FIG. 2 may also be used to condition the signals in the transmitter 230 and receiver 250. Unless otherwise noted, any signal in FIG. 2, or any other illustrations in the drawings, may be either single-ended or differential. Some circuit blocks in FIG. 2 may also be omitted.

In the example shown in FIG. 2, the wireless device 200 generally includes the transceiver 220 and a data processor 210. The data processor 210 may include a memory (not shown) to store data and program codes, and may generally include analog and digital processing elements. The transceiver 220 may include the transmitter 230 and receiver 250 that support bi-directional communication. In general, the wireless device 200 may include any number of transmitters and/or receivers for any number of communication systems and frequency bands. All or a portion of the transceiver 220 may be implemented on one or more analog integrated circuits (ICs), radio frequency (RF) integrated circuits (RFICs), mixed-signal ICs, and the like.

A transmitter or a receiver may be implemented with a super-heterodyne architecture or a direct-conversion architecture. In the super-heterodyne architecture, a signal is frequency-converted between radio frequency and baseband in multiple stages, e.g., from radio frequency to an intermediate frequency (IF) in one stage, and from intermediate frequency to baseband in another stage for a receiver. In the direct-conversion architecture, a signal is frequency-converted between radio frequency and baseband in one stage. The super-heterodyne and direct-conversion architectures may use different circuit blocks and/or have different requirements. In the example shown in FIG. 2, the transmitter 230 and the receiver 250 are implemented with the direct-conversion architecture.

In a transmit path, the data processor 210 processes data to be transmitted. The data processor 210 also provides in-phase (I) and quadrature (Q) analog output signals to the transmitter 230 in the transmit path. In an exemplary aspect, the data processor 210 includes digital-to-analog converters (DACs) 214a and 214b for converting digital signals generated by the data processor 210 into the in-phase (I) and quadrature (Q) analog output signals (e.g., I and Q output currents) for further processing.

Within the transmitter 230, lowpass filters 232a and 232b filter the in-phase (I) and quadrature (Q) analog transmit signals, respectively, to reduce undesired images caused by the prior digital-to-analog conversion. Amplifiers (Amp) 234a and 234b amplify the signals from lowpass filters 232a and 232b, respectively, and provide in-phase (I) and quadrature (Q) baseband signals. An upconverter 240 including upconversion mixers 241a and 241b upconverts the in-phase (I) and quadrature (Q) baseband signals with in-phase (I) and quadrature (Q) transmit (TX) local oscillator (LO) signals from a TX LO signal generator 290 to provide an upconverted signal. A filter 242 filters the upconverted signal to reduce undesired images caused by the frequency upconversion as well as interference in a receive frequency band. A power amplifier (PA) 244 amplifies the signal from filter 242 to obtain the desired output power level and provides a transmit radio frequency signal. The transmit radio frequency signal is routed through a duplexer/switch 246 and transmitted via an antenna 248.

In a receive path, the antenna 248 receives communication signals and provides a received radio frequency (RF) signal, which is routed through the duplexer/switch 246 and provided to a low noise amplifier (LNA) 252. The duplexer/switch 246 is designed to operate with a specific receive (RX) to transmit (TX) (RX-to-TX) duplexer frequency separation, such that RX signals are isolated from TX signals. The received RF signal is amplified by the LNA 252 and filtered by a filter 254 to obtain a desired RF input signal. Downconversion mixers 261a and 261b mix the output of the filter 254 with in-phase (I) and quadrature (Q) receive (RX) LO signals (i.e., LO_I and LO_Q) from an RX LO signal generator 280 to generate in-phase (I) and quadrature (Q) baseband signals. The in-phase (I) and quadrature (Q) baseband signals are amplified by amplifiers 262a and 262b and further filtered by lowpass filters 264a and 264b to obtain in-phase (I) and quadrature (Q) analog input signals, which are provided to the data processor 210. In the exemplary configuration shown, the data processor 210 includes analog-to-digital converters (ADCs) 216a and 216b for converting the analog input signals into digital signals for further processing by the data processor 210.

In FIG. 2, the transmit local oscillator (TX LO) signal generator 290 generates the in-phase (I) and quadrature (Q) TX LO signals used for frequency upconversion, while a receive local oscillator (RX LO) signal generator 280 generates the in-phase (I) and quadrature (Q) RX LO signals used for frequency downconversion. Each LO signal is a periodic signal with a particular fundamental frequency. A phase locked loop (PLL) 292 receives timing information from the data processor 210 and generates a control signal used to adjust the frequency and/or phase of the TX LO signals from the TX LO signal generator 290. Similarly, a PLL 282 receives timing information from the data processor 210 and generates a control signal used to adjust the frequency and/or phase of the RX LO signals from the RX LO signal generator 280.

The wireless device 200 may support carrier aggregation and may (i) receive multiple downlink signals transmitted by one or more cells on multiple downlink carriers at different frequencies, and/or (ii) transmit multiple uplink signals to one or more cells on multiple uplink carriers. For intra-band carrier aggregation, the transmissions are sent on different carriers in the same band. For inter-band carrier aggregation, the transmissions are sent on multiple carriers in different bands. Those skilled in the art will understand, however, that aspects described herein may be implemented in systems, devices, and/or architectures that do not support carrier aggregation.

Figure 3:
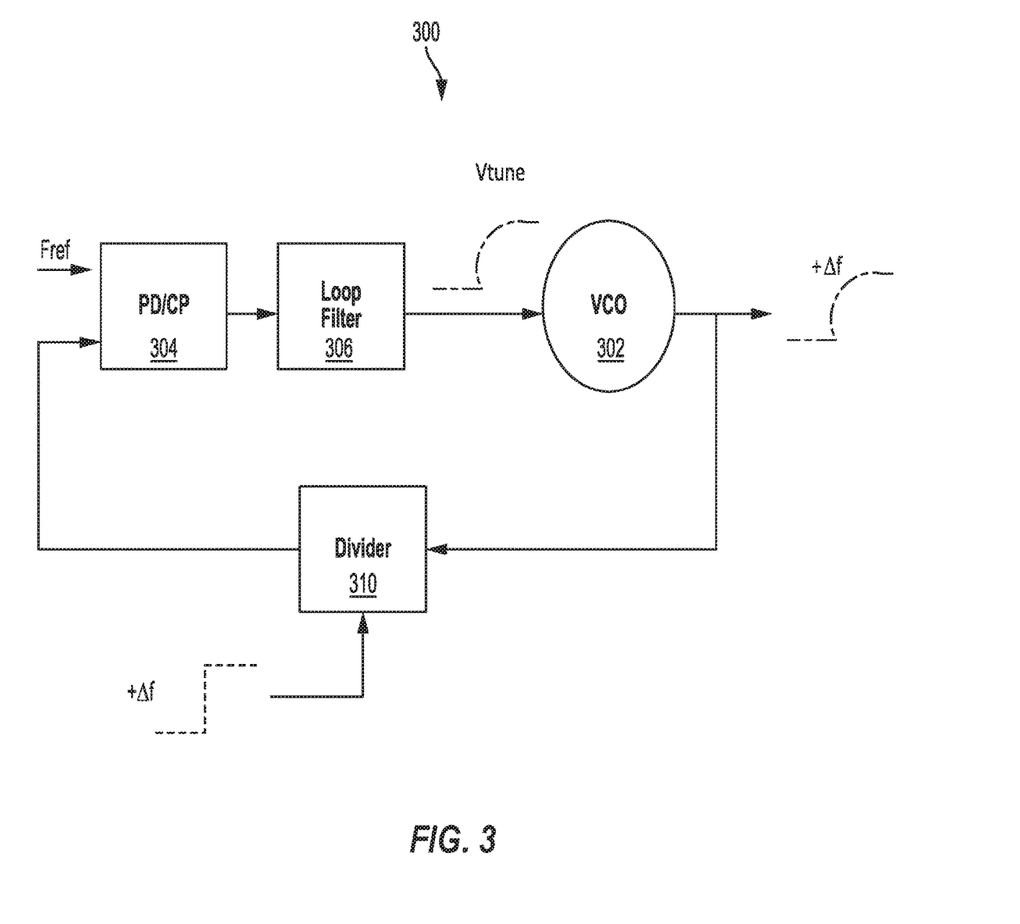
FIG. 3 illustrates a phase lock loop (PLL) system according to aspects of the present disclosure.

FIG. 3 illustrates a phase lock loop (PLL) system 300. The PLL system 300 includes a voltage controlled oscillator (VCO) 302, a phase detector 304, a loop filter (e.g., low pass filter) 306, and a frequency divider 310. The PLL system 300 may be integrated in a mobile communication device. For example, the PLL system 300 may be implemented in a radio frequency (RF) module of the mobile communication device.

The phase detector 304 may be coupled to the loop filter 306, the loop filter 306 may be coupled to the VCO 302, the VCO 302 may be coupled to the frequency divider 310 and the frequency divider 310 may be coupled to the phase detector 304 to close a feedback loop. The output of the VCO 302 may be a sinusoid with a particular frequency that is controlled by a tuning voltage Vtune, which is received by the VCO 302 from the loop filter 306. For example, changing the tuning voltage Vtune changes the frequency of the VCO 302. To synthesize a desirable or exact frequency of the VCO 302, the output frequency of the VCO 302 is fed back to the frequency divider 310. The phase detector 304 compares an output of the frequency divider 310 with a reference signal (e.g., reference signal Fref). In some aspects, the reference frequency may be generated by a stable local crystal oscillator (not shown).

Figure 4A:
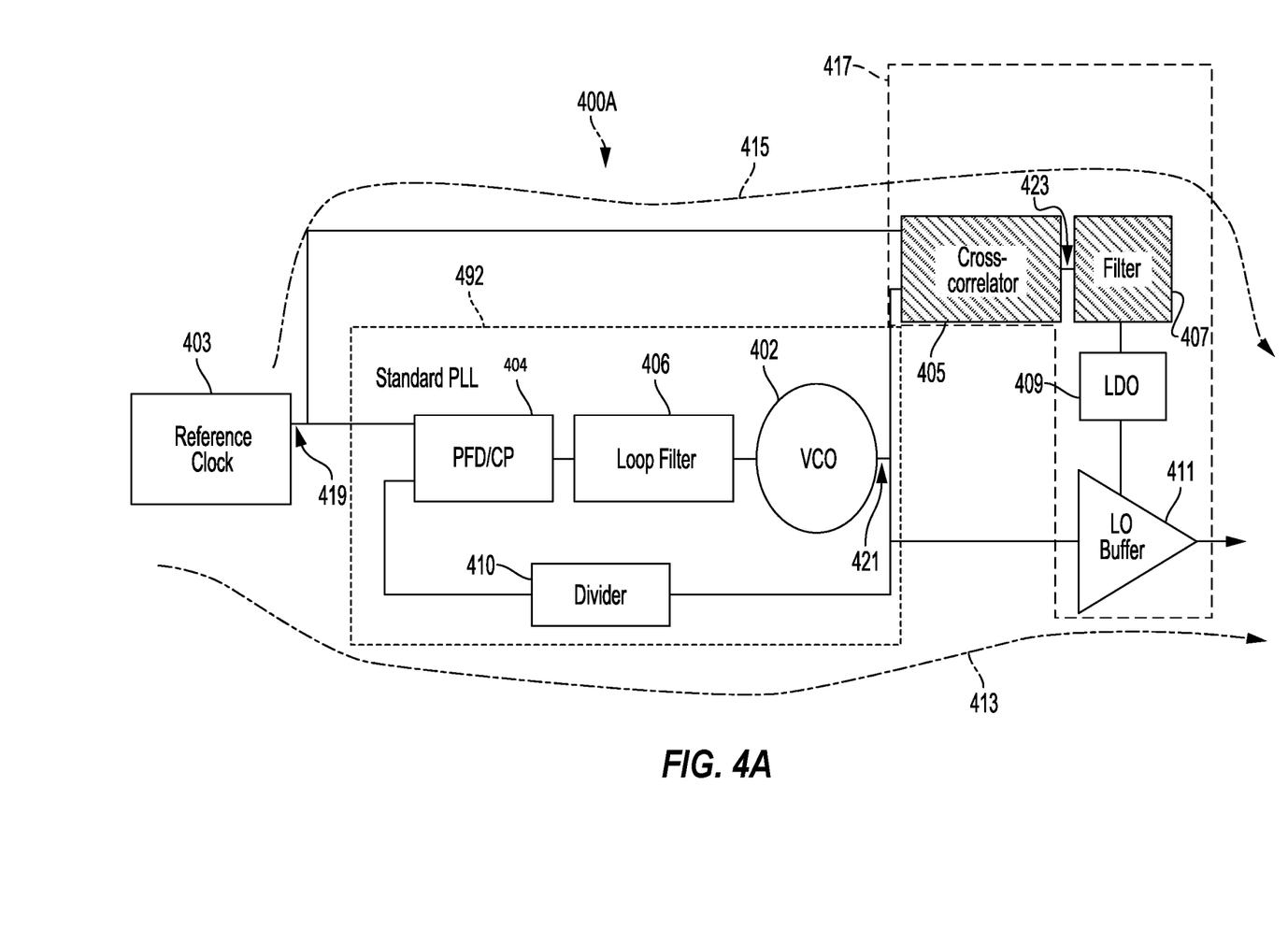
FIG. 4A illustrates an open-loop feed-forward cross-correlator noise cancellation device according to aspects of the present disclosure.

FIG. 4A illustrates an open-loop feed-forward cross-correlator noise cancellation device 400A, according to aspects of the present disclosure. The open-loop feed-forward cross-correlator noise cancellation device 400A is directed to phase noise improvement and spur reduction in a synthesizer. The open-loop feed-forward cross-correlator noise cancellation device 400A may include a synthesizer in a primary (or default) path 413 and a correlated sampling phase noise cancellation device 417 in a secondary path 415. In some aspects, the synthesizer may be a PLL feedback system that includes a PLL 492. The PLL 492 includes an oscillator, such as a voltage controlled oscillator (VCO) 402, a phase detector 404, a loop filter 406 (e.g., low pass filter), and a PLL frequency divider 410. In one aspect, the phase detector 404 may be a phase frequency detector (PFD), a charge pump (CP), or a combination of a phase frequency detector and a charge pump. In some aspects, all or some parts of the correlated sampling phase noise cancellation device 417 may be disabled.

The correlated sampling phase noise cancellation device 417 may include a cross-correlator 405, an open-loop filter 407, a low dropout (LDO) regulator 409 and a buffer 411. The PLL 492 may receive a reference signal or reference clock signal 419 from a reference signal source device 403. The reference signal source device 403 may be a reference signal generating source, such as a crystal or reference clock. The reference clock signal 419 is provided to both the phase detector 404 and the cross-correlator 405. Thus, some level of correlation exists between the primary path 413 and the secondary path 415 because both paths receive the reference clock signal 419 from the same reference signal source device 403.

Additional circuits of the PLL 492 (e.g., the VCO 402, the loop filter 406 and the phase detector 404) generate a higher frequency at an output of the PLL 492 that is a multiple (or different divider or multiplier) of the frequency of the reference signal source device 403. The additional circuits of the PLL 492 introduce additional noise that adds to noise of an input signal and the reference clock signal 419. To reduce the noise associated with the additional circuits, aspects of the present disclosure sample an output frequency signal 421 (from the VCO 402) with the reference clock signal 419, in accordance with an open-loop feed-forward configuration (e.g., without the feedback loop).

In one aspect, the cross-correlator 405, such as a phase detector, cross-correlates the reference clock signal 419 and the output frequency signal 421 to generate a cross-correlated output/control signal 423 at the output of the cross-correlator 405. Input noise (e.g., correlated in-band reference phase noise) of the reference clock signal 419 may be filtered by the loop filter 406 within the PLL 492, leaving the additional noise from the additional circuits. This follows because the noise at the output of the cross-correlator 405 is dominated by uncorrelated noise from the additional circuits.

Some level of correlation exists between the inputs of the cross-correlator 405. For example, the correlation is due to the fact that the cross-correlator 405 receives the reference clock signal 419 and an output frequency signal 421, which is based on the reference clock signal 419. However, some uncorrelated noise is introduced into the primary path 413 by the additional circuits of the PLL 492. For example, in an ideal situation when the additional circuits are free of noise, the cross-correlator 405 receives the reference clock signal 419 from the reference signal source device 403 and the output frequency signal 421 (which in this case is essentially a noise-free reference clock-based signal) that cancel each other out. The output at the cross-correlator 405 in this ideal situation is zero because no correction is necessary. Some implementations include a frequency synthesizer in the primary path 413 at an output of the PLL 492. However, including the synthesizer changes the frequency of the output frequency signal 421.

The cross-correlated output signal 423 is provided to an open-loop filter 407 where remnants of the correlated in-band correlated reference phase noise are filtered out, leaving uncorrelated noise from the additional circuits of the PLL 492. The uncorrelated noise is then provided to a signal control delay line (e.g., voltage/current/charge control delay line). In one particular embodiment, the signal control delay line may include the LDO regulator 409 and the buffer 411. The signal control delay line reverses the uncorrelated noise to generate an anti-phase noise signal to counter the uncorrelated noise in the primary path 413 of the PLL 492. For example, the anti-phase noise signal is injected into the primary path 413 at the output of the signal control delay line.

In one aspect of the disclosure, the signal control delay line may be a phase modulator that is coupled to the output of the cross-correlator 405. The phase modulator may modulate a phase of the synthesized output clock signal (e.g., the output frequency signal 421) based on the cross-correlated output/control signal 423. The phase modulation causes the cancellation of the noise generated by the additional circuits of the PLL 492. For example, the modulation yields the anti-phase noise signal that is injected to counter the uncorrelated noise to improve the clock output signal from the PLL 492. The frequency of the output frequency signal 421 is the same before and after the injection of the anti-phase noise signal. The signal control delay line can also be a voltage controlled delay line, current controlled delay line or a charge controlled delay line.

Figure 4B:
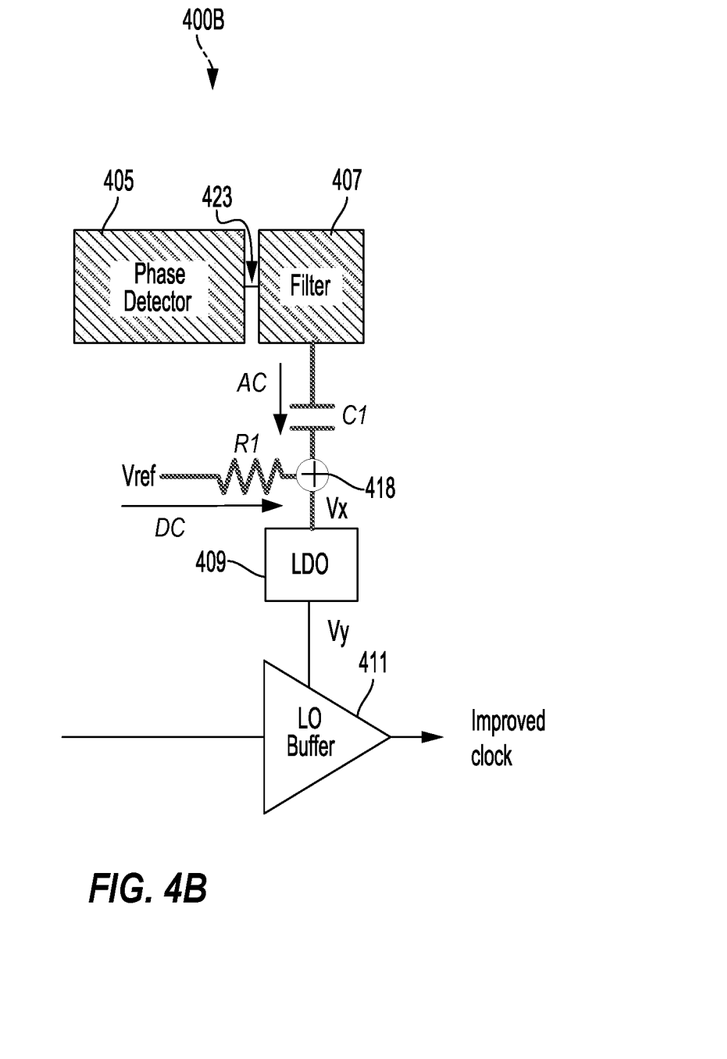
FIG. 4B illustrates a correlated sampling phase noise cancellation device according to aspects of the present disclosure.

FIG. 4B illustrates a correlated sampling phase noise cancellation device 400B according to aspects of the present disclosure. For illustrative purposes, some of the labelling and numbering of the devices and features of FIG. 4B are similar to those of the FIG. 4A. For example, the correlated sampling phase noise cancellation device 400B includes the cross correlator 405, such as a phase detector. The phase detector may be a sampled phase detector to sample received signals. The correlated sampling phase noise cancellation device 400B may also include the open-loop filter 407, the LDO regulator 409 and the buffer 411.

Similar to the correlated sampling phase noise cancellation device 417, the correlated sampling phase noise cancellation device 400B may be coupled to the PLL 492 and the reference clock 403. The correlated sampling phase noise cancellation device 400B, however, includes a combiner 418. The correlated sampling phase noise cancellation device 400B further includes a capacitor C1 and a resistor R1. The capacitor C1 may be coupled between the combiner 418 and the filter 407. The resistor R1 may be coupled between the reference voltage Vref and the combiner 418. Other configurations of the combiner may be applicable to aspects of the present disclosure.

The combiner 418 combines the cross-correlated control signal (e.g., an alternating current (AC) signal) from the cross correlator 405 with a reference signal (e.g., a direct current (DC) voltage) from a reference voltage Vref. Accordingly, an output of the combiner Vx is in a linear relationship with the reference voltage Vref. The combiner 418 may be coupled between the open-loop filter 407 and the signal control delay line, which includes the LDO regulator 409 and the buffer 411. For example, the output of the combiner 418 may be a combination of the DC voltage and the AC signal. In one aspect of the disclosure, the buffer 411 of the signal control delay line may convert the combination of the DC voltage and the AC signal back to a phase domain to cancel out or modulate the phase noise of the clock signal. In one aspect, the signal (e.g., voltage) control delay line may be part of an existing signal control delay line instead of an independent signal control delay line. For example, the existing signal control delay line may be part of the circuitry of receive blocks, transmit blocks and/or other timing critical blocks. The delay change of the buffer corresponds to phase modulation.

A modulation scheme improves the clock output signal from the PLL 492. For example, a modulation according to the modulation scheme yields the anti-phase noise signal that is injected to counter the uncorrelated noise to improve the clock output signal from the PLL 492. The uncorrelated noise may include phase noise information. At least a portion of the phase noise information that is extracted is an undesired phase noise that comes from the reference clock signal 419. The modulation (e.g., amplitude modulation) is based on the reference clock signal 419 and the cross-correlated output signal 423. For example, the modulation may be a modulation of the LO buffer supply, with extracted phase noise information from the sampled phase detector and filter.

After the cross-correlator 405, the cross-correlated output signal 423 includes the extracted phase noise information from the reference clock signal 419 in the voltage domain. In one aspect, phase modulation introduces an anti-phase of the phase noise to cancel the phase noise. Using an LDO, the phase modulation is implicitly achieved (with a gain of the inverse of the slope rate of the buffer) by amplitude modulating the buffer supply through the LDO. The extracted phase noise information is applied to the output frequency signal 421 (e.g., a LO signal), which includes a same phase noise as the reference clock signal 419, in an anti-phased manner by the modulation scheme to correct an original phase noise.

For example, a noise affected output frequency signal 421 is provided to the buffer 411. The buffer cleans up the noisy output frequency signal 421, while the output signal Vy from the output of the combiner 418 controls a delay of the buffer 411. The output signal Vy includes the DC reference signal and the AC phase noise information to modulate the output frequency signal 421 of a noisy clock based on anti-phase noise. An improved clock is generated at the output of the buffer based on the modulation.

Figure 5:
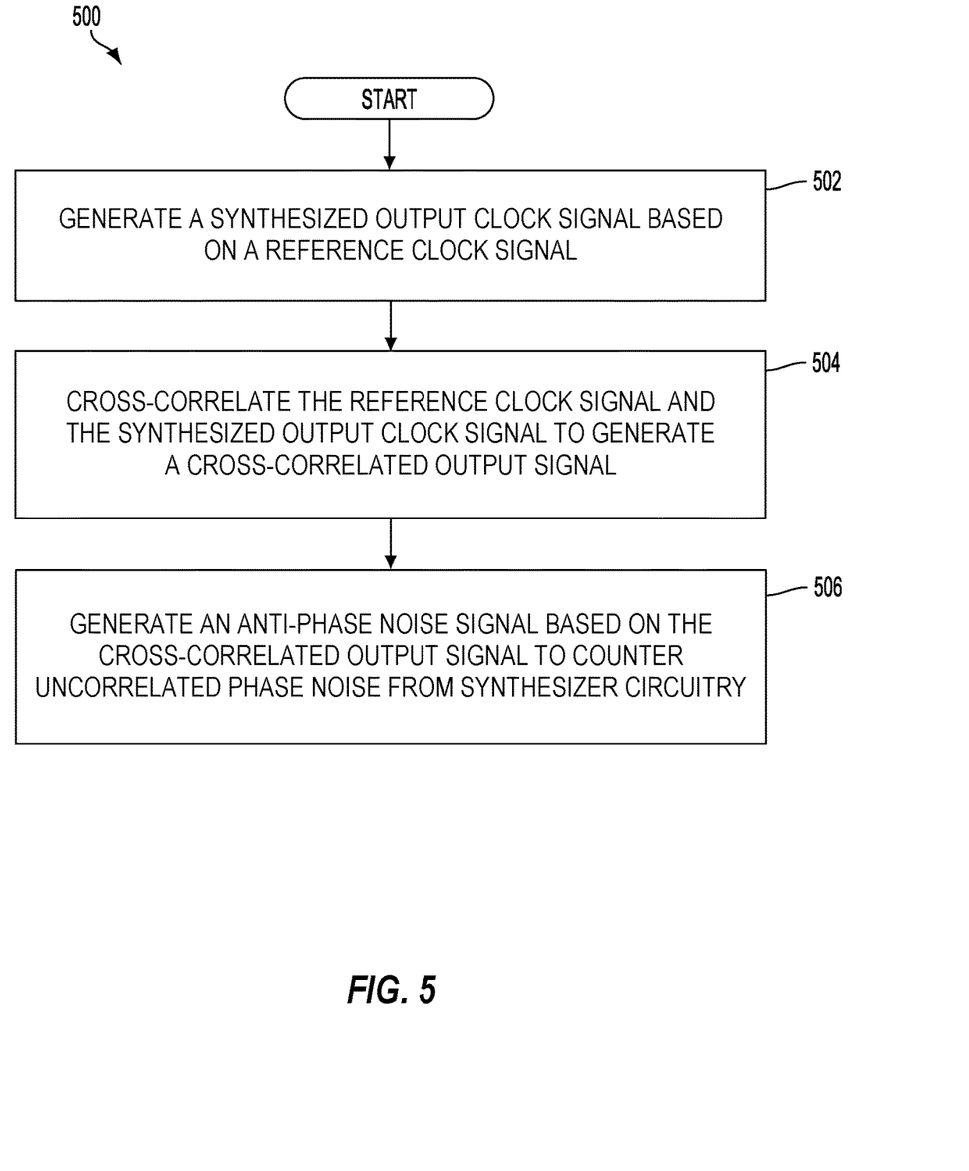
FIG. 5 depicts a simplified flowchart of a method to achieve open-loop feed-forward cross-correlator noise cancellation according to aspects of the present disclosure.

FIG. 5 depicts a simplified flowchart of a method 500 to achieve open-loop feed-forward cross-correlator noise cancellation, according to aspects of the present disclosure. At block 502, a synthesizer of an open-loop feed-forward cross-correlator noise cancellation device generates a synthesized output clock signal based on a reference clock signal. At block 504, a cross-correlator device of the open-loop feed-forward cross-correlator noise cancellation device receives the reference clock signal and the synthesized output clock signal and cross-correlates the reference clock signal and the synthesized output clock signal to generate a cross-correlated output signal. At block 506, a signal control delay line of the open-loop feed-forward cross-correlator noise cancellation device generates an anti-phase noise signal based on the cross-correlated output signal to counter uncorrelated phase noise from circuitry of the synthesizer.

According to a further aspect of the present disclosure, the open-loop feed-forward phase noise and spur cancellation device includes means for generating an anti-phase noise signal. The anti-phase noise signal generating means may be the signal control delay line, a phase modulator and/or a buffer. The open-loop feed-forward phase noise and spur cancellation device includes means for generating the synthesized output clock signal. The means for generating the synthesized output clock signal may be a synthesizer. In another aspect, the aforementioned means may be any module, or any apparatus configured to perform the functions recited by the aforementioned means.

Figure 6:
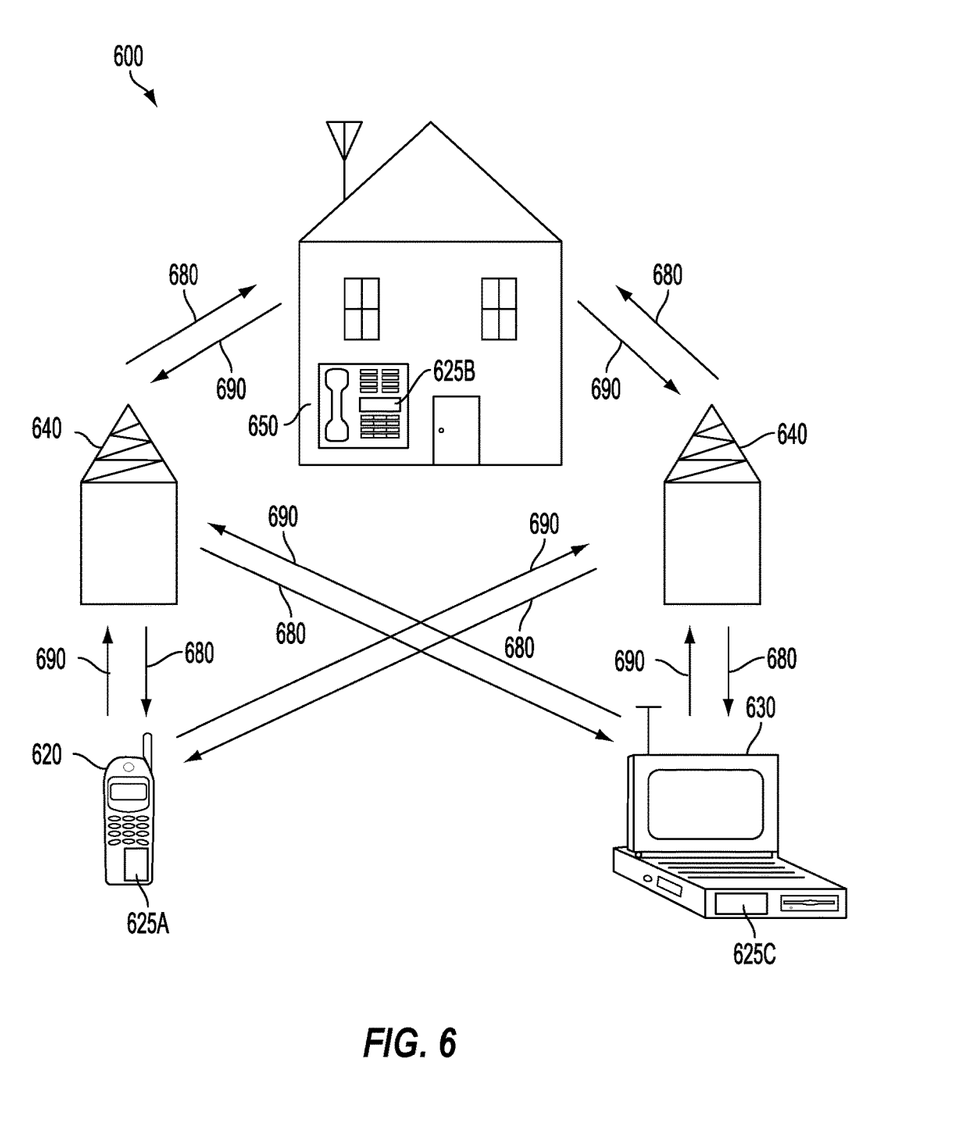
FIG. 6 is a block diagram showing an exemplary wireless communication system in which a configuration of the disclosure may be advantageously employed.

FIG. 6 is a block diagram showing an exemplary wireless communication system in which a configuration of the disclosure may be advantageously employed. For purposes of illustration, FIG. 6 shows three remote units 620, 630, and 650 and two base stations 640. It will be recognized that wireless communication systems may have many more remote units and base stations. Remote units 620, 630, and 650 include IC devices 625A, 625B, and 625C that include the disclosed open-loop feed-forward cross-correlator noise cancellation device. It will be recognized that other devices may also include the disclosed open-loop feed-forward cross-correlator noise cancellation device, such as the base stations, switching devices, and network equipment. FIG. 6 shows forward link signals 680 from the base station 640 to the remote units 620, 630, and 650 and reverse link signals 690 from the remote units 620, 630, and 650 to base station 640.

In FIG. 6, remote unit 620 is shown as a mobile telephone, remote unit 630 is shown as a portable computer, and remote unit 650 is shown as a fixed location remote unit in a wireless local loop system. For example, a remote unit may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieves data or computer instructions, or combinations thereof. Although FIG. 6 illustrates remote units according to the aspects of the disclosure, the disclosure is not limited to these exemplary illustrated units. Aspects of the disclosure may be suitably employed in many devices, which include the open-loop feed-forward cross-correlator noise cancellation device.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, include compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill in the art would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic device, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. Storage media may be any available media that can be accessed by a general-purpose or special-purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "a step for."

What is claimed is:

1. An open-loop feed-forward cross-correlator noise cancellation device, comprising:
   a synthesizer to generate a synthesized output clock signal based at least in part on a reference clock signal;
   a cross-correlator device coupled to the synthesizer to receive the reference clock signal and the synthesized output clock signal and to cross-correlate the reference clock signal and the synthesized output clock signal to generate a cross-correlated output signal; and
   a delay line coupled to the cross-correlator device, a delay of the delay line based at least in part on the cross-correlated output signal.

2. The open-loop feed-forward cross-correlator noise cancellation device of claim 1, in which the delay line is configured to generate an anti-phase noise signal based at least in part on the cross-correlated output signal to counter uncorrelated phase noise from additional circuitry of the synthesizer.

3. The open-loop feed-forward cross-correlator noise cancellation device of claim 2, further comprising a combiner to combine the cross-correlated output signal with a reference signal, in which the anti-phase noise signal is based at least in part on the reference signal and the cross-correlated output signal.

4. The open-loop feed-forward cross-correlator noise cancellation device of claim 1, further comprising an open-loop filter coupled between the cross-correlator device and the delay line.

5. The open-loop feed-forward cross-correlator noise cancellation device of claim 1, in which the delay line comprises a voltage controlled delay line, a current controlled delay line or a charge controlled delay line.

6. The open-loop feed-forward cross-correlator noise cancellation device of claim 1, in which the delay line comprises a low dropout (LDO) regulator and a buffer.

7. The open-loop feed-forward cross-correlator noise cancellation device of claim 1, in which the cross-correlator device comprises a phase detector.

8. The open-loop feed-forward cross-correlator noise cancellation device of claim 1, in which the synthesizer comprises a phase locked loop, a delay locked loop, or a phase/frequency synthesizer.

9. The open-loop feed-forward cross-correlator noise cancellation device of claim 1, in which the open-loop feed-forward cross-correlator noise cancellation device is incorporated in a reference clock signal and synthesizer system for an analog-to-digital converter (ADC), a digital-to-analog converter (DAC), a central processing unit (CPU), a receive block of a wireless communication device or a transmit block of the wireless communication device.

10. A method to achieve open-loop feed-forward cross-correlator noise cancellation, comprising:
generating a synthesized output clock signal based at least in part on a reference clock signal;
cross-correlating the reference clock signal and the synthesized output clock signal to generate a cross-correlated output signal; and
generating an anti-phase noise signal based at least in part on the cross-correlated output signal to counter uncorrelated phase noise from circuitry of a synthesizer.

11. The method to achieve open-loop feed-forward cross-correlator noise cancellation of claim 10, further comprising filtering out correlated input noise from the reference clock signal leaving the uncorrelated phase noise.

12. The method to achieve open-loop feed-forward cross-correlator noise cancellation of claim 10, further comprising combining the cross-correlated output signal with a reference signal, in which the anti-phase noise signal is based at least in part on the reference signal and the cross-correlated output signal.

13. The method to achieve open-loop feed-forward cross-correlator noise cancellation of claim 10, in which the method is implemented using an open-loop feed-forward cross-correlator noise cancellation device.

14. The method to achieve open-loop feed-forward cross-correlator noise cancellation of claim 13, further comprising incorporating the open-loop feed-forward cross-correlator noise cancellation device in a reference clock signal and synthesizer system for an analog-to-digital converter (ADC), a digital-to-analog converter (DAC), a central processing unit (CPU), a receive block of a wireless communication device or a transmit block of the wireless communication device.

15. An open-loop feed-forward cross-correlator noise cancellation device, comprising:
means for generating a synthesized output clock signal based at least in part on a reference clock signal;
a cross-correlator device, coupled to the synthesized output clock signal generating means, to receive the reference clock signal and the synthesized output clock signal and to cross-correlate the reference clock signal and the synthesized output clock signal to generate a cross-correlated output signal; and
means for generating a delay based at least in part on the cross-correlated output signal, the delay generating means coupled to the cross-correlator device.

16. The open-loop feed-forward cross-correlator noise cancellation device of claim 15, in which the delay generating means is configured to generate an anti-phase noise signal based at least in part on the cross-correlated output signal to counter uncorrelated phase noise from additional circuitry of the synthesized output clock signal generating means.

17. The open-loop feed-forward cross-correlator noise cancellation device of claim 16, further comprising a combiner to combine the cross-correlated output signal with a reference signal, in which the anti-phase noise signal is based at least in part on the reference signal and the cross-correlated output signal.

18. The open-loop feed-forward cross-correlator noise cancellation device of claim 15, further comprising an open-loop filter coupled between the cross-correlator device and the delay generating means.

19. The open-loop feed-forward cross-correlator noise cancellation device of claim 15, in which the cross-correlator device comprises a phase detector.

20. The open-loop feed-forward cross-correlator noise cancellation device of claim 15, in which the open-loop feed-forward cross-correlator noise cancellation device is incorporated in a reference clock signal and synthesizer system for an analog-to-digital converter (ADC), a digital-to-analog converter (DAC), a central processing unit (CPU), a receive block of a wireless communication device or a transmit block of the wireless communication device.

* * * * *